United States Patent
Gambini et al.

(10) Patent No.: US 8,195,221 B2
(45) Date of Patent: Jun. 5, 2012

(54) LOOP DELAY COMPENSATION FOR CONTINUOUS TIME SIGMA DELTA ANALOG TO DIGITAL CONVERTER

(75) Inventors: Simone Gambini, Oakland, CA (US); Hasnain Lakdawala, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 967 days.

(21) Appl. No.: 12/215,874

(22) Filed: Jun. 30, 2008

(65) Prior Publication Data

US 2009/0325632 A1 Dec. 31, 2009

(51) Int. Cl.
*H04M 1/00* (2006.01)
*H03M 1/12* (2006.01)

(52) U.S. Cl. ............... 455/550.1; 341/126; 341/155; 341/143

(58) Field of Classification Search ........... 455/550.1, 455/90.1, 90.3, 403, 73; 341/126, 143, 118, 341/144, 155
See application file for complete search history.

(56) References Cited

U.S. PATENT DOCUMENTS

| | | | | |
|---|---|---|---|---|
| 5,357,252 A * | 10/1994 | Ledzius et al. | ........ | 341/143 |
| 6,621,441 B2 * | 9/2003 | Haroun et al. | ........ | 341/155 |
| 6,738,003 B2 * | 5/2004 | Melanson | ........ | 341/143 |
| 6,920,471 B2 * | 7/2005 | Chan et al. | ........ | 708/300 |
| 7,183,957 B1 * | 2/2007 | Melanson | ........ | 341/143 |
| 7,248,193 B2 * | 7/2007 | Fujimoto | ........ | 341/143 |
| 7,298,305 B2 * | 11/2007 | Melanson | ........ | 341/143 |
| 7,663,522 B2 * | 2/2010 | Koli | ........ | 341/143 |
| 7,982,647 B2 * | 7/2011 | Souda | ........ | 341/143 |

OTHER PUBLICATIONS

Mitteregger et al., A 20-mW 640-MHz CMOS Continuous-Time$\Sigma$-$\Delta$ ADC With 20-MHz Signal Bandwidth, 80-dB Dynamic Range and 12-bit ENOB; IEEE Journal of Solid-State Circuits, vol. 41, Issue 12, Dec. 2006; pp. 2641-2649.

* cited by examiner

*Primary Examiner* — Sonny Trinh
(74) *Attorney, Agent, or Firm* — Trop, Pruner & Hu, P.C.

(57) ABSTRACT

A continuous time sigma delta analog to digital converter may use a finite impulse response filter for delay compensation. In some embodiments, the filter may be simplified by using only the first and/or second filter coefficients.

11 Claims, 3 Drawing Sheets

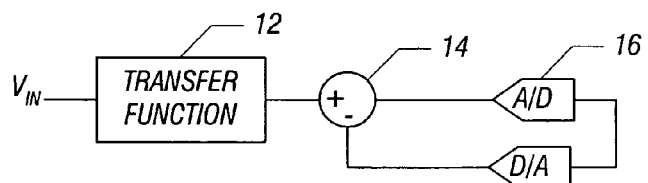
FIG. 2
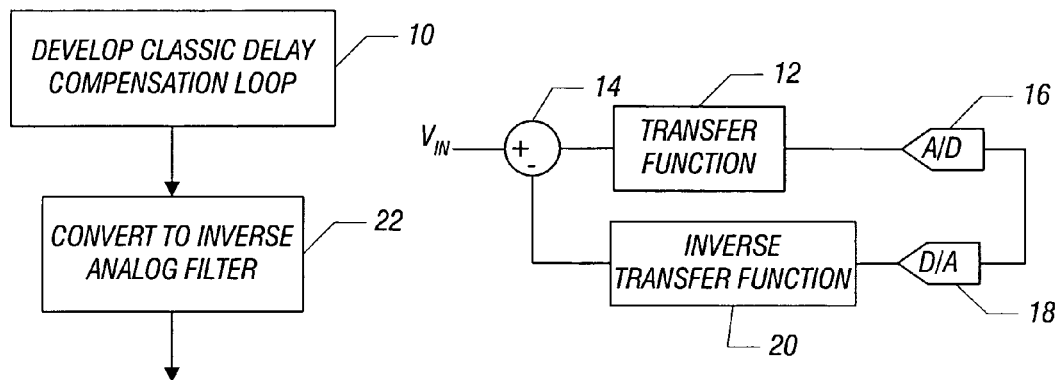
FIG. 3
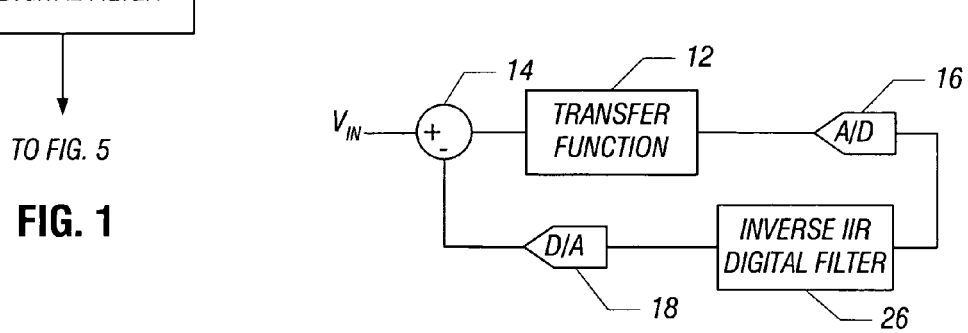
FIG. 4
DEVELOP CLASSIC DELAY COMPENSATION LOOP — 10
↓
CONVERT TO INVERSE ANALOG FILTER — 22
↓
CONVERT TO INVERSE IIR DIGITAL FILTER — 24
↓
TO FIG. 5
FIG. 1

LOOP DELAY COMPENSATION FOR CONTINUOUS TIME SIGMA DELTA ANALOG TO DIGITAL CONVERTER

BACKGROUND

This relates generally to analog to digital converters.

Sigma delta converters are noise shaping, oversampled data converters that realize processing gains in effective dynamic range by accepting increased conversion time in order to realize higher conversion accuracy. Accuracy is achieved by employing an oversample rate that is greater than the Nyquist sampling rate. Furthermore, multilevel feedback gains may be incorporated to further extend dynamic range.

The sigma delta analog to digital converter measures at low resolution, but high rate. In order to form a continuous time analog to digital converter, the sample may be taken inside the feedback loop instead of at the input. Nonetheless, the system may become very sensitive to the delay of the loop.

Thus, delay compensation systems are useful. More particularly, a compensation loop is needed for the delay in the feedback gain g. That compensation may be achieved by compensating the forward gain h.

By making the phase of the g term "early" and the phase of the h term "late," a phase lead network can be established.

BRIEF DESCRIPTION OF THE DRAWINGS

FIG. 1 is a flow chart for one embodiment of the present invention;

FIG. 2 is a circuit schematic for the first stage in the development of one embodiment of the present invention;

FIG. 3 is a circuit schematic for a second stage in the development of one embodiment of the present invention;

FIG. 4 is a circuit schematic of the third stage in the development of one embodiment of the present invention;

DETAILED DESCRIPTION

Figure 6:
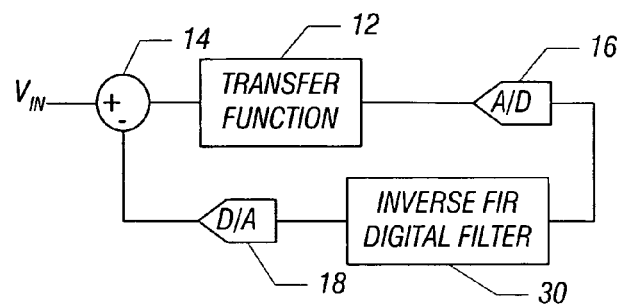
FIG. 6 is a circuit schematic for a fourth stage in the development of a circuit in accordance with one embodiment of the present invention.

The design of a finite impulse response (FIR) based continuous time analog to digital sigma delta converter may be understood as a series of design transitions. In some embodiments, the use of a digital or semi-digital FIR filter may be advantageous. While infinite impulse response (IIR) filters are generally easier to provide, they have more delay. Thus, in a delay compensation scheme, the use of the FIR digital filter in the way described herein may be advantageous in some cases.

Referring to FIG. 1, the FIR filter design process for loop delay compensation may begin with a classic delay compensation loop, as indicated in block 10. The delay compensation loop seeks to provide a phase lead network. Specifically, as shown in FIG. 2, shows a part of a sigma delta analog to digital converter 8. The loop filter of the sigma delta modulator consists of a transfer function 12 and a feedback network to compensate for filter delay. The loop filter of the sigma delta converter can be as designed to compensate the excess delay of the loop can be designed as in See, e.g., "A 20-MW 640-MHZ CMOS Continuous-Time Sigma Delta ADC with 20-MHZ Signal Bandwidth 80-db Dynamic Range and 12-bit EWOB," Mitteregger, Gerhard et al., IEEE Journal of Solid State Circuits, Vol. 41, No. 12, December 2006.

The transfer function 12 that, for example may be (K1s+1)/s, is a part of the over loop filter transfer function of the sigma delta modulator. The output of the transfer function is a state variable that is provided to the additional input of a buffer/summing amplifier 14. This compensates for the excess delay in the sigma delta modulator feedback loop. The amplifier 14 is coupled to a coarse analog to digital converter 16 that, in turn, is coupled to a digital to analog converter 18, that couples to the minus input of the summing amplifier 14. The summing amplifier 14 performs the addition of the state variable and the subtraction of the feedback coefficient.

The summer 14, in FIG. 2, typically requires additional components that can add further delays and power. It is desirable to exclude this summer by incorporating it in the amplifier that implements the transfer function 12.

A low pass impedance is coupled with a high pass compensation device. The impedance may be used to provide passive summation of loop filter state variables in a continuous time sigma delta modulator. The compensation device uses delays and digital to analog converters. The combination of the impedance and the combination filter may provide direct feedback paths that stabilize the loop filter characteristic in the presence of loop delays.

Referring to block 22 of FIG. 1, the next step is to convert to an inverse analog filter, shown in FIG. 3. To avoid the use of the buffer or summer, the transfer function 12 can be implemented using a passive filter driven by a current source. This may eliminate the direct feedback input. The direct feedback can then be applied at the input of the transfer function 12 after appropriate inverse filtering 20. Thus, the inverse filter 20 is provided to the minus input of the summing amplifier 14 and the transfer function 12 is provided inside the loop.

Implementation of the inverse filter in the digital domain may be desirable. However, an exact implementation involves an infinite impulse response digital filter that employs feedback and thereby limits the maximum converter sampling speed.

Thus, as shown in FIG. 4, it is possible to convert to an inverse infinite impulse response filter 26, as indicated at block 24 in FIG. 1. To do this, the inverse infinite impulse response digital filter 26 is provided between the analog to digital converter 16 and the digital to analog converter 18.

Figure 5:
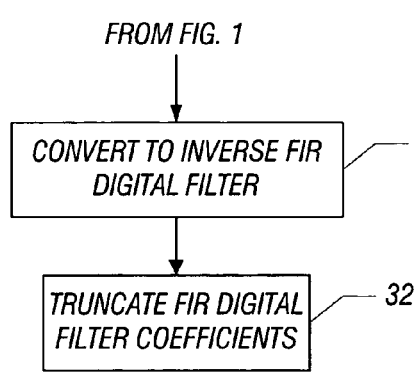
FIG. 5 is a flow chart which is a continuation of FIG. 1.

Referring to FIG. 5 and block 28, the inverse infinite response digital filter can be converted to an inverse finite impulse response digital or semi-digital filter 30, as shown in FIG. 6. Approximating the infinite impulse response filter with a finite impulse response semi-digital filter relaxes the speed constraint with the same system performance in some embodiments. The finite impulse response filter 30 can be implemented in a semi-digital fashion by using current mode digital to analog converters with outputs coupled in phase or in any phase with digital delays.

Figure 6A:
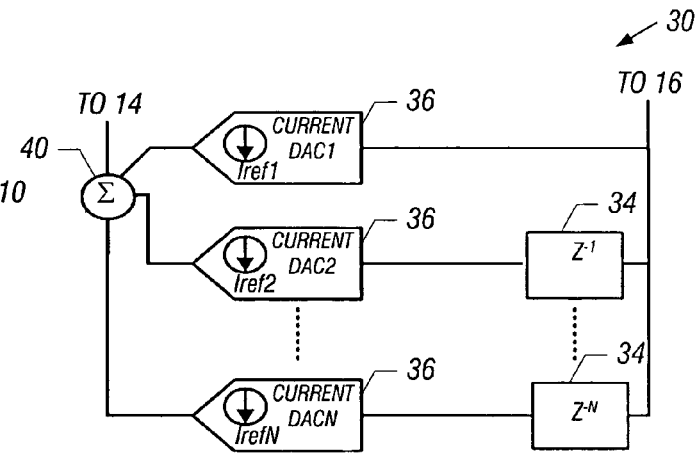
FIG. 6A is a circuit schematic for an inverse FIR digital filter in one embodiment.

One implementation of the inverse FIR digital filter 30, shown in FIG. 6, is shown in FIG. 6A. It includes a summer 40 coupled to a current digital to analog converter 36, implemented by a current source that creates a first reference current ($I_{ref1}$), and one to N delay elements 34. Each delay element 34 is coupled to additional current digital to analog converters 36 in the form of current sources that produce reference currents $I_{ref2}$ to $I_{refN}$. The summation of the N reference currents implements the inverse FIR digital filter 30.

Figure 8:
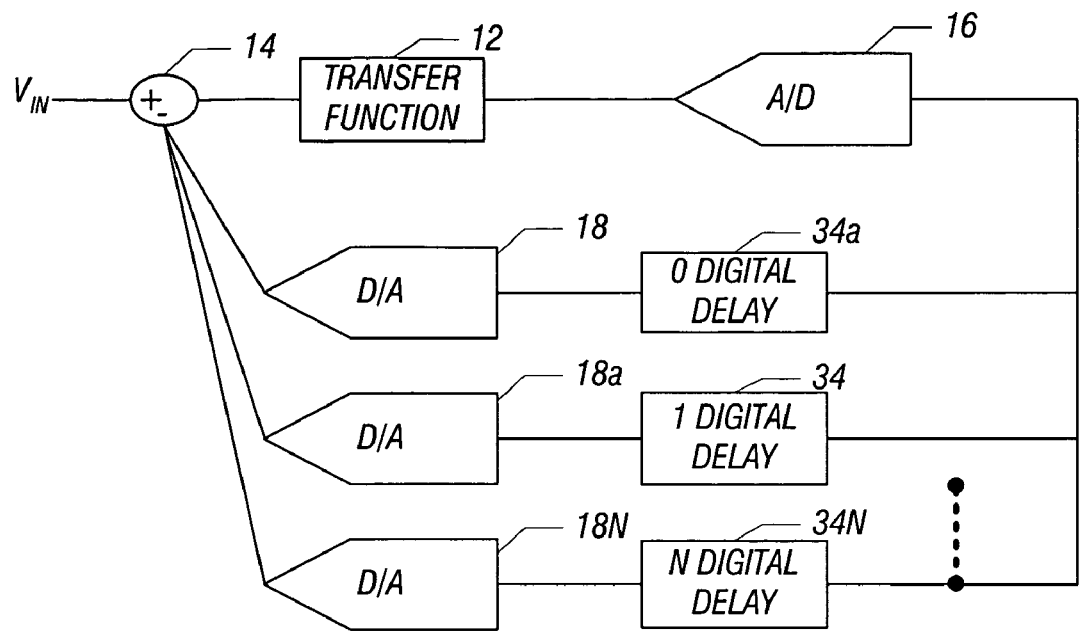
FIG. 8 is a circuit schematic of another embodiment of the present invention.

Thus, referring to FIG. 8, the filter 30 may include the digital to analog converters 18, 18a, all the way to 18n. Digital delays 34a to 34n may be provided. A summation of the delayed digital to analog converter outputs implements a finite impulse response filter with current summing.

Figure 7:
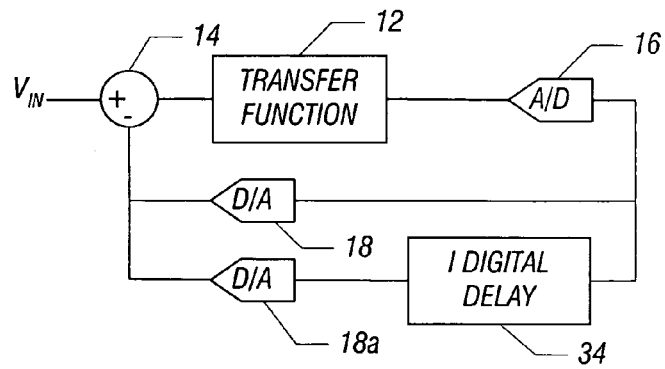
FIG. 7 is a circuit schematic of the final stage in the development of one embodiment of the present invention.

However, referring to FIG. 5, block 32 and FIG. 7, it has been determined that a much simpler approach may be utilized. This is the result of the appreciation that the effect of all but the first two coefficients of the filter, shown in FIG. 8, on the net result is insignificant. For example, the first term may have a value of 1, the second term a value of 0.25, but the third term may be down to 0.01. So the infinite impulse response filter can be designed by approximating using only one digital delay 34 in one embodiment.

This approximation may be done by transferring the first input to a binomial sequence and taking the first term of the binomial expansion for the digital finite impulse response filter.

In some embodiments, the MATLAB software may be used to implement such an approximation. MATLAB 7.0.1 (R13) SP1, The MathWorks, Natick, Mass. 2005. Specifically, the MATLAB software will provide a FIR filter design from an inverse infinite response filter design and everything after the second coefficient can simply be discarded.

Alternatively, the design can be done empirically by first finding a FIR filter that gives the same response as an infinite impulse response filter, using only one or two coefficients. This may be done without a feedback loop with only the forward loop.

A finite impulse response filter provides a moving average filter that does weighted averages. It looks at three previous samples and sums them up to make a new sample. The use of the FIR filter instead of an infinite impulse response filter, despite its complexity, is advantageous here since it may have less delay.

Much of the complexity of a FIR filter can be reduced by simply truncating the FIR filter coefficients, as indicated in block 32 of FIG. 5. The taps of the FIR filter may be chosen adaptively to annihilate the first taps of the sampled impulse response of the impedance. The combination of the impedance and the compensation filter implements direct feedback that stabilizes the loop filter characteristic in the presence of loop delays.

Figure 9:
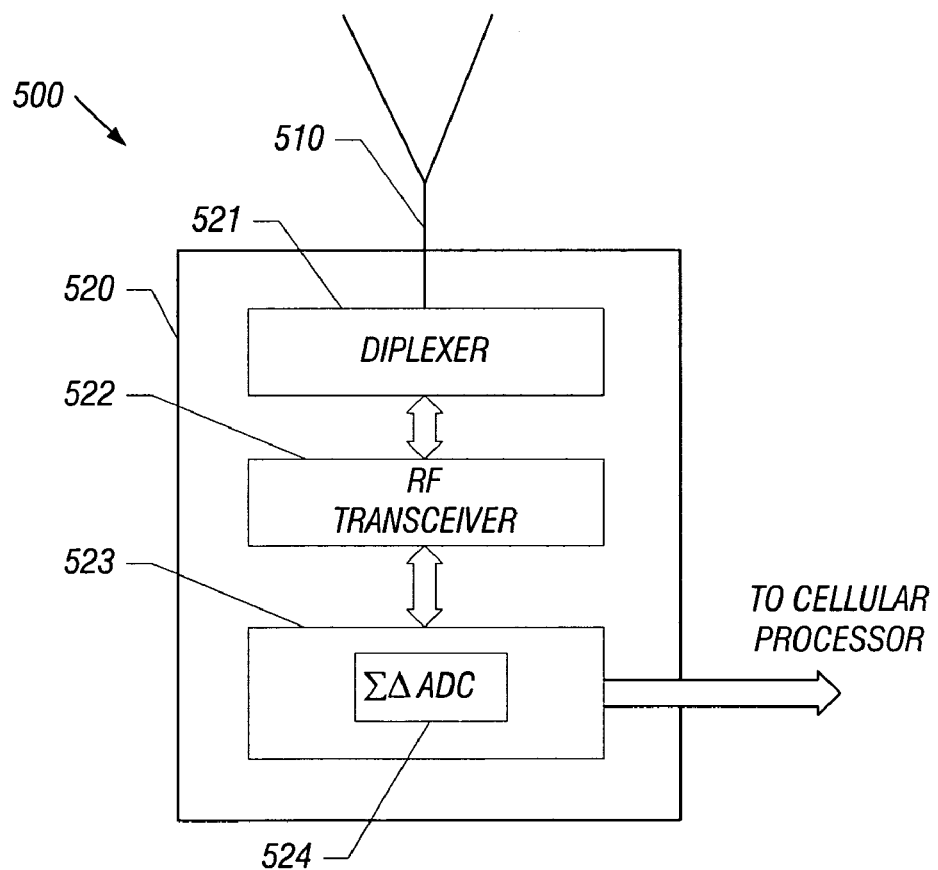
FIG. 9 is a system depiction in accordance with one embodiment.

The sigma-delta analog to digital converter may be incorporated into an analog front end (AFE) that constitutes part of a cellular telephone system. One embodiment of such an AFE is depicted in FIG. 9. A cellular telephone system 500 includes an antenna 510 that is coupled to an AFE 520. AFE 520, in turn, may comprise in one embodiment, a duplexer 521 that couples an RF (radio frequency) transceiver 522 to an antenna 521. Specifically in the transmit mode of operation, diplexer 521 couples the transmitter section of RF transceiver 522 to antenna 510. In the receive mode, diplexer 521 couples the receiver section of RF transceiver 522 to antenna 510. RF transceiver 522 is also coupled to an analog mixed signal section 523 may incorporate a sigma-delta analog to digital converter 524 to perform, for example, a modulation and/or demodulation function. AFE 520 is coupled to a cellular processor (not shown).

In addition, skilled practitioners recognize that embodiments may also be realized in software (or in the combination of software and hardware) that may be executed on a host system, such as, for example, a computer system, a wireless device, or the like. Accordingly, such embodiments may comprise an article in the form of a machine-readable storage medium onto which there are written instructions, data, etc. that constitute a software program that defines at least an aspect of the operation of the system. The storage medium may include, but is not limited to, any type of disk, including floppy disks, optical disks, compact disk read-only memories (CD-ROMs), compact disk rewritables (CD-RWs), and magneto-optical disks, and may include semiconductor devices such as read-only memories (ROMs), random access memories (RAMs), erasable programmable read-only memories (EPROMs), electrically erasable programmable read-only memories (EEPROMs), flash memories, magnetic or optical cards, or any type of media suitable for storing electronic instructions. Similarly, embodiments may be implemented as software modules executed by a programmable control device, such as a computer processor or a custom designed state machine.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   providing a continuous time sigma delta analog to digital converter with a low pass filter having a finite impulse response filter;
   providing a pair of feedback loops with digital to analog converters coupled to said continuous time sigma delta analog to digital converter;
   coupling said digital to analog converters to a summing amplifier; and
   coupling said summing amplifier to a transfer function block.

2. The method of claim 1 including using no more than two coefficients in said filter.

3. The method of claim 1 including providing a digital delay in one of said feedback loops.

4. An apparatus comprising:
   a summing amplifier;
   a transfer function unit coupled to said amplifier and coupled to an analog to digital converter; and
   a pair of feedback loops coupled from said analog to digital converter to said summing amplifier, each of said loops including a digital to analog converter, one of said loops including a digital delay coupled to one of said digital to analog converters.

5. The apparatus of claim 4 wherein said apparatus to approximate a finite impulse response filter.

6. The apparatus of claim 4 using only two feedback coefficients.

7. A sigma delta analog to digital converter comprising:
   a summing amplifier;
   a transfer function unit coupled to said summing amplifier;
   an analog to digital converter coupled to said transfer function; and a feedback loop including an inverse finite impulse response digital filter and a digital to analog converter coupled in series, said digital to analog converter coupled to said summing amplifier.

8. The converter of claim 7 wherein said filter is approximated with only the first two coefficients of the filter.

9. A cellular telephone comprising:

an analog front end; and an analog to digital coupled to a sigma delta analog to digital converter, said analog to digital converter being an inverse finite impulse response filter, wherein said filter is an approximation of a finite impulse response filter with two feedback loops, one loop including a digital to analog converter and the other loop including a digital to analog converter in series with a digital delay.

10. The telephone of claim 9, said converter including a summing amplifier.

11. The telephone of claim 10 including a transfer function coupled to said summing amplifier and an analog to digital converter coupled to said transfer function and to said feedback loops, said feedback loops also coupled to said summing amplifier.

* * * * *